US008878615B2

United States Patent
Wu et al.

(10) Patent No.: US 8,878,615 B2
(45) Date of Patent: Nov. 4, 2014

(54) VOLTAGE-CONTROLLED OSCILLATOR DEVICE AND METHOD OF CORRECTING VOLTAGE-CONTROLLED OSCILLATOR

(75) Inventors: Yuping Wu, Beijing (CN); Lan Chen, Beijing (CN)

(73) Assignee: Institute of Microelectronics, Chinese Academy of Sciences, Beijing (CN)

( * ) Notice: Subject to any disclaimer, the term of this patent is extended or adjusted under 35 U.S.C. 154(b) by 61 days.

(21) Appl. No.: 13/518,958

(22) PCT Filed: Oct. 9, 2011

(86) PCT No.: PCT/CN2011/080556
§ 371 (c)(1),
(2), (4) Date: Jun. 25, 2012

(87) PCT Pub. No.: WO2013/053087
PCT Pub. Date: Apr. 18, 2013

(65) Prior Publication Data
US 2013/0088302 A1     Apr. 11, 2013

(51) Int. Cl.
*H03B 1/04*  (2006.01)
*H03L 1/00*  (2006.01)
*H03L 7/099*  (2006.01)
*H03L 7/00*  (2006.01)

(52) U.S. Cl.
CPC . *H03L 7/00* (2013.01); *H03L 7/099* (2013.01)
USPC .............................. 331/44; 331/105; 331/175

(58) Field of Classification Search
USPC .............. 327/133; 331/44, 105, 175; 332/124
See application file for complete search history.

(56) References Cited

U.S. PATENT DOCUMENTS

| 3,569,867 | A | * | 3/1971 | Ernst | 331/177 R |
| 3,628,134 | A | * | 12/1971 | Andersen | 324/619 |
| 4,277,763 | A | * | 7/1981 | Ward, Jr. | 331/96 |
| 4,291,277 | A | * | 9/1981 | Davis et al. | 330/149 |
| 4,546,328 | A | * | 10/1985 | Smith et al. | 331/4 |

(Continued)

FOREIGN PATENT DOCUMENTS

| CN | 1518209 A | 8/2004 |
| CN | 1820417 A | 8/2006 |

(Continued)

OTHER PUBLICATIONS

Mizutani et al., "A Millimeter-Wave Highly Linear VCO MMIC with Compact Tuning Voltage Converter", Proceedings of the 1st European Microwave Integrated Circuits Conference, Sep. 2006, pp. 529-532.*

(Continued)

*Primary Examiner* — Levi Gannon
(74) *Attorney, Agent, or Firm* — Westman, Champlin & Koehler, P.A.

(57) ABSTRACT

The present application discloses a voltage-controlled oscillator device and a method of correcting the voltage-controlled oscillator. The voltage-controlled oscillator device comprises predistortion module, configured to predistort an input voltage to obtain a predistorted voltage; and a voltage-controlled oscillator, configured to generate an output signal with a corresponding oscillation frequency according to the predistorted voltage, wherein the predistortion module corrects a non-linear characteristic of the voltage-controlled oscillator, so that there is a linear relationship between the input voltage and the oscillation frequency of the output signal. The voltage-controlled oscillator device may be applied to a phase-locked circuit in a communication system.

17 Claims, 5 Drawing Sheets

(56) References Cited

U.S. PATENT DOCUMENTS

| | | | |
|---|---|---|---|
| 4,595,888 A * | 6/1986 | Miller | 332/124 |
| 5,557,241 A | 9/1996 | Burke | |
| 6,112,062 A * | 8/2000 | Hans et al. | 455/114.3 |
| 7,099,643 B2 | 8/2006 | Lin | |
| 7,132,874 B2 * | 11/2006 | McCorquodale et al. | 327/347 |
| 7,522,011 B2 * | 4/2009 | Matero et al. | 332/128 |
| 7,541,883 B2 | 6/2009 | Knecht et al. | |
| 7,592,943 B2 * | 9/2009 | Beasley | 342/27 |
| 7,675,379 B1 * | 3/2010 | Groe | 332/144 |
| 7,746,187 B2 * | 6/2010 | Lee et al. | 332/145 |
| 7,907,021 B2 | 3/2011 | Chen | |

FOREIGN PATENT DOCUMENTS

| | | |
|---|---|---|
| CN | 101093616 A | 12/2007 |
| CN | 101375575 A | 2/2009 |
| CN | 101479956 A | 7/2009 |
| CN | 101626356 A | 1/2010 |
| JP | 2003258560 A | 9/2003 |

OTHER PUBLICATIONS

International Search Report (in Chinese) for PCT Application No. PCT/CN2011/080556, dated Jul. 12, 2012, 4 pages.

Written Opinion (in Chinese) for International Search Report for PCT Application No. PCT/CN2011/080556, dated Jul. 12, 2012, 6 pages.

"Research on Digital Pre-distortion Technique"; Min Gao; Perspectives of Science and Technology in Gansu Province, vol. 40, No. 1, 2011, pp. 14-15, 2 pages total (1 page of English abstract).

"Enhancement of VCO Linearity and Phase Noise by Implementing Frequency Locked Loop"; Ayranci et al.; EUROCON 2007 the International Conference on "Computer as a Tool"; Warsaw; Sep. 9-12; 7 pages.

"A Fast and High-Precision VCO Frequency Calibration Technique for Wideband ΔΣ Fractional-N Frequency Synthesizers"; Shin et al.; IEEE Transactions on Circuits and Systems—I: Regular Papers, vol. 57, No. 7, Jul. 2010, 10 pages.

"High Linearity Voltage-Controlled Oscillator"; Le Nguyen Phuong Thi, U059292X; National University of Singapore; 33 pages.

"Fast VCO Frequency Calibration Techniques for PLL Applications"; Lin et al.; Bulletin of the College of Engineering, N.T.U., No. 93; Feb. 2005, pp. 31-38, 8 total pages.

"VCO Design with On-Chip Calibration System"; Vaananen et al.; IEEE Transactions on Circuits and Systems—I: Regular Papers, vol. 53, No. 10, Oct. 2006, 10 pages.

"A 10-GHz CMOS PLL with an Agile VCO Calibration"; Lai et al.; National Science Council, Taiwan, R.O.C.; 2005 IEEE; 4 pages.

"VCO Gain Calibration Technique for GSM/EDGE Polar Modulated Transmitter"; Ahn et al.; 2008 IEEE Radio Frequency Integrated Circuits Symposium; 4 pages.

"Least Mean Square calibration method for VCO non-linearity"; Venkatram et al.; 22nd International Conference on Microelectronics (ICM 2010); IEEE 2009; 4 pages.

"VCO Gain Nonlinearity Calibration with Frequency Offset/Drift Compensation for 3G/GSM/EDGE Polar Modulation Transmitter"; Miyanaga et al.; RWS 2011; 2011 IEEE; 4 pages.

First Chinese Office Action for Chinese Application No. 201110303167.1, dated Nov. 23, 2012, 7 pages.

The English translation for the first Chinese Office Action for Chinese Application No. 201110303167.1, dated Nov. 23, 2012, 7 pages.

* cited by examiner

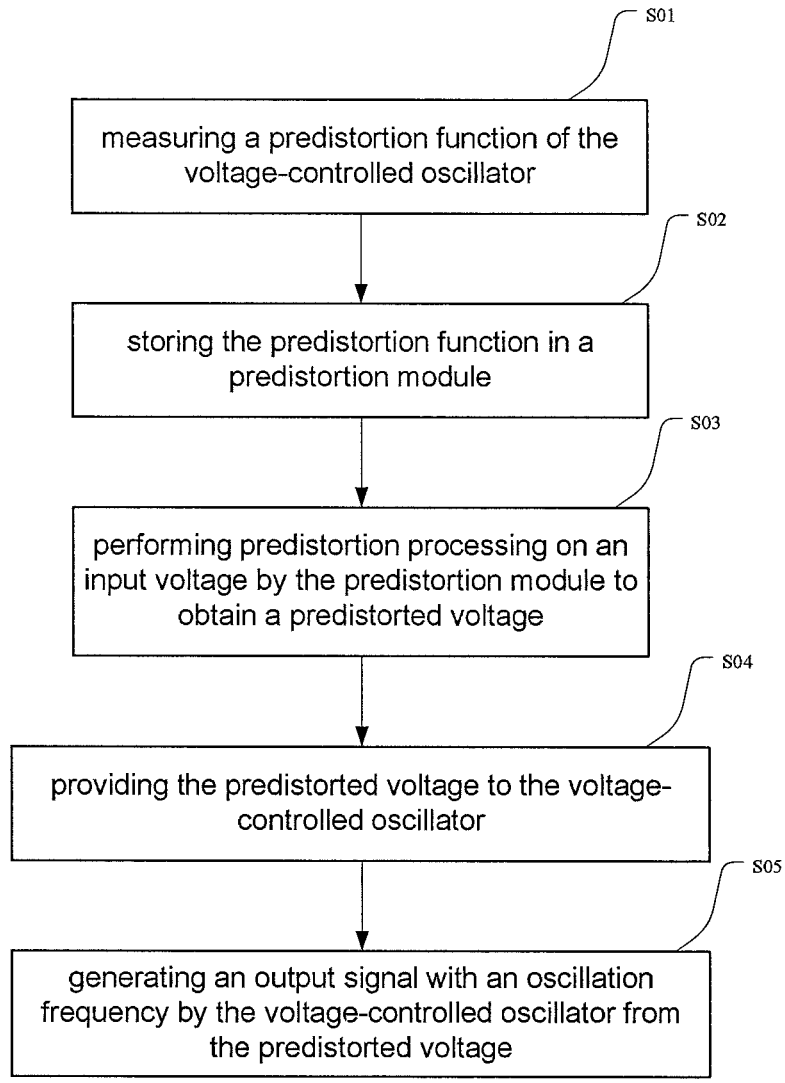
Fig. 9 (newly-added)

VOLTAGE-CONTROLLED OSCILLATOR DEVICE AND METHOD OF CORRECTING VOLTAGE-CONTROLLED OSCILLATOR

CROSS-REFERNCE TO RELATED APPLICATION

This application is a National Phase application of, and claims priority to, PCT Application No. PCT/CN2011/080556, filed on Oct. 9, 2011, entitled "Voltage-Controlled Oscillator Device And Method Of Correcting Voltage-Controlled Oscillator", which is incorporated herein by reference in its entirety.

TECHNICAL FIELD

The disclosure relates to a voltage-controlled oscillator (VCO) device and a method of correcting the VCO. In particular, the disclosure relates to a VCO device with a high linearity and a large linear range.

BACKGROUND

A voltage-controlled oscillator (VCO) is one of important basic components of a phase-locked loop (PLL) circuit in a modern communication system. A performance of the modern communication system may greatly depend on the performance of the PLL circuit, and a performance of the PLL circuit may greatly depend on a performance of the VCO. Therefore, the performance of the modern communication system may depend on the performance of the VCO to a great extent.

With continuous advances in the integrated circuit technique, feature sizes of devices and metal wirings are continuously reduced. Consequently, the devices have a limited linearity and a limited linear range.

FIG. 1 schematically illustrates a block diagram of a conventional VCO 11. In the conventional VCO 11, an input voltage vin may be directly applied to an input of the VCO 11, and an output signal with an oscillation frequency f may be output from an output of the VCO 11.

$$f = f0 + k * vin \ tm \quad (1)$$

wherein, f is an oscillation frequency of the output signal when a voltage value of a control signal at a VCO input is vin;

f0 is the oscillation frequency of the output signal when the voltage value of the control signal at the VCO input is 0;

vin is the voltage value of the control signal as the VCO input; and k is a control factor of the oscillation frequency of the output signal of the yea FIG. 2 illustrates an ideal curve showing an input voltage vs. an oscillation frequency of the conventional VCO 11 as shown in FIG. 1. The linear range of the conventional VCO 11 is $-vin_{max} \leq vin \leq +vin_{max}$, wherein k is a constant only depending on electric characteristics of the VCO 11

However, the linear range of the VCO 11 is only an approximation, which ignores a high-order effect of the VCO 11, but not really an ideal linear range, Even in the linear range of $-vin_{max} \leq vin \leq +vin_{max}$, k is not really a constant, as shown in a dashed line in FIG. 3.

To improve the linearity and increase the linear range of the VCO, k should not be seen as a constant.

SUMMARY OF THE DISCLOSURE

One object of the present disclosure is to provide a voltage-controlled oscillator device with a high linearity and a large linear range, and a method for correcting the voltage-controlled oscillator.

According to one aspect of the present disclosure, a voltage-controlled oscillator device is provided. The voltage-controlled oscillator comprises: a predistortion module, configured to predistort an input voltage to obtain a predistorted voltage; and a voltage-controlled oscillator, configured to generate an output signal with a corresponding oscillation frequency according to the predistorted voltage, wherein the predistortion module corrects a non-linear characteristic of the voltage-controlled oscillator, so that there is a linear relationship between the input voltage and the oscillation frequency of the output signal.

According to another aspect of the present disclosure, a method of correcting a voltage-controlled oscillator is provided. The method comprises: measuring a predistortion function of the voltage-controlled oscillator; storing the predistortion function in a predistortion module; performing predistortion processing on an input voltage by the predistortion module to obtain a predistorted voltage; providing the predistorted voltage to the voltage-controlled oscillator; and generating an output signal with a corresponding oscillation frequency by the voltage-controlled oscillator according to the predistorted voltage, wherein the predistortion module corrects a non-linear characteristic of the voltage-controlled oscillator, so that there is a linear relationship between the input voltage and the oscillation frequency of the output signal.

The voltage-controlled oscillator device of the present disclosure corrects the non-linear characteristic of the voltage-controlled oscillator using the predistortion module, so that the linearity of the voltage-controlled oscillator may be improved, and/or the linear range of the voltage-controlled oscillator may be extended.

BRIEF DESCRIPTION OF THE DRAWINGS

FIG. 9 shows a flow chart of a method of correcting an VCO according to the present dislosure.

DETAILED DESCRIPTION

The inventor recognizes that an input voltage of a VCO 11 may be predistorted to compensate variation of the control factor k and provide a linear output of the VCO 11.

In order to perform the predistortion processing, a predistortion function $v_{predistortion}(vin)$ of the VCO 11 needs to be firstly obtained. The predistortion function $V_{predistortion}(vin)$ represents a relationship between the input voltage vin and a predistorted voltage vin'. Although the control factor k may be varied, there is still a linear relationship between the input voltage vin and an oscillation frequency f of the VCO 11.

Hereinafter, the present disclosure will be described in detail with reference to the drawings.

Figure 4:
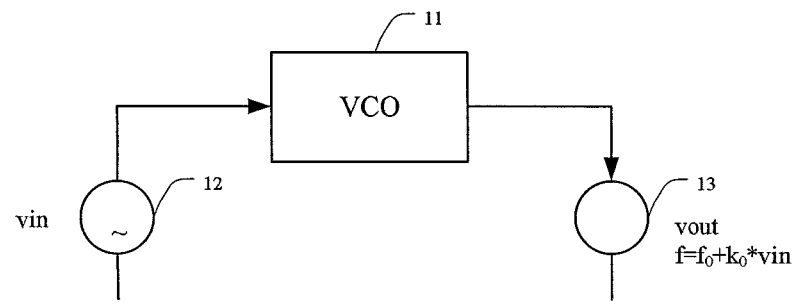
FIG. 4 schematically illustrates a block diagram of a measurement circuit for obtaining a predistortion function of a VCO according to the present disclosure.

FIG. 4 schematically illustrates a block diagram of a measurement circuit 10 for obtaining the predistortion function of the VCO 11 according to the present disclosure. An input port of the VCO 11 may be connected to a controllable voltage source 12 for supplying a variable input voltage vin to the input port of the VCO 11. The range of the input voltage vin is a designed linear range, and may be larger than a linear range, e. g. $-vin'_{max} \leq vin \leq +vin'_{max}$, of characteristics of the VCO itself, wherein $vin'_{max} > vin_{max}$. An output port of the VCO 11 may be connected to a signal frequency measurement unit 13 for measuring an oscillation frequency f of an output signal of the VCO 11.

The VCO 11 may be an RC VCO, an LC VCO, a crystal VCO or an active VCO.

The input voltage vin may be applied for a selected sampling point. The corresponding oscillation frequency f of the output signal may be calculated according to Equation (1). Then, an actual oscillation frequency of the output signal of the VCO 11 may be measured by the signal frequency measurement unit 13 while adjusting the input voltage of the controllable voltage source 12. When the actual oscillation frequency of the output signal of the VCO 11 is the calculated oscillation frequency f of the output signal, the predistorted voltage vin' may be determined from an actual output voltage of the controllable voltage source 12. Therefore, the relationship between the input voltage vin and the predistorted voltage vin' may be obtained for the selected sampling point.

The above adjusting and measuring steps may be repeated for all of the selected sampling points within the range of $-vin'_{max} \leq vin \leq +vin'_{max}$. Thus, the relationship between the input voltage vin and the predistorted voltage vin' may be obtained for a plurality of sampling points in the designed operating range, which is taken as the predistortion function of the VCO 11.

Uniform sampling may be used. That is, the relationship between the input voltage vin and the predistorted voltage vin' may be obtained at uniform voltage intervals. Alternatively, non-uniform sampling may also be used, That is, sampling points may be selected according to the linear characteristic of the VCO 11. The smaller absolute value vin has, the lower density of sampling points is. When vin has an absolute value approaching $vin'_{max}$, the density of sampling points is higher . . .

The predistortion function $v_{predistortion}(v)$ may be implemented as a digital look-up table, in which vin and corresponding vin' are stored. That is, a mapping relationship of vin-vin' is built.

Figure 5:
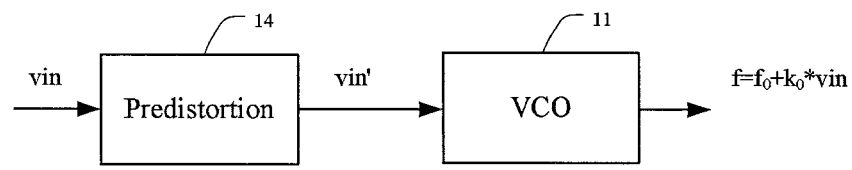
FIG. 5 schematically illustrates a block diagram of a VCO device according to the present disclosure.

FIG. 5 schematically illustrates a block diagram of a VCO device 20 according to the present disclosure. Compared to the conventional VCO 11, the VCO device 20 of the present disclosure adds a predistortion module 14 between the input voltage vin and the VCO 11. The predistortion module 14 performs voltage conversion by predistorting the input voltage vin according to the predistortion function $v_{predistortion}(v)$ as discussed above, so as to generate and provide the predistorted voltage vin' to the VCO 11.

When the predistortion module 14 performs the predistortion processing, it may be firstly determined whether the input voltage vin is out of the designed linear range, i. e. $-vin'_{max} \leq vin \leq +vin'_{max}$. If so, the predistortion module 14 does not perform the predistortion processing on the input voltage vin.

FIG. 9 shows a flow chart of a method of correcting an VCO according to the present disclosure, which may by performed in the VCO device 20 as shown in FIG. 5. At step S01, a predistortion function of the voltage-controlled oscillator is measured. At step S02, the predistortion function is stored in a predistortion module. At step S03, predistortion processing is performed on an input voltage by the predistortion module to obtain a predistorted voltage. At step S04, the predistorted voltage is provided to the voltage-controlled oscillator. At step S05, an output signal with an oscillation frequency is generated by the voltage-controlled oscillator according to the predistorted voltage. The predistortion module corrects a non-linear characteristic of the voltage-controlled oscillator, so that there is linear relationship between the input voltage and the oscillation frequency of the output signal.

Figure 1:
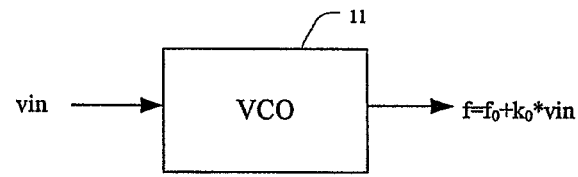
FIG. 1 schematically illustrates a block diagram of a conventional VCO.
Figure 2:
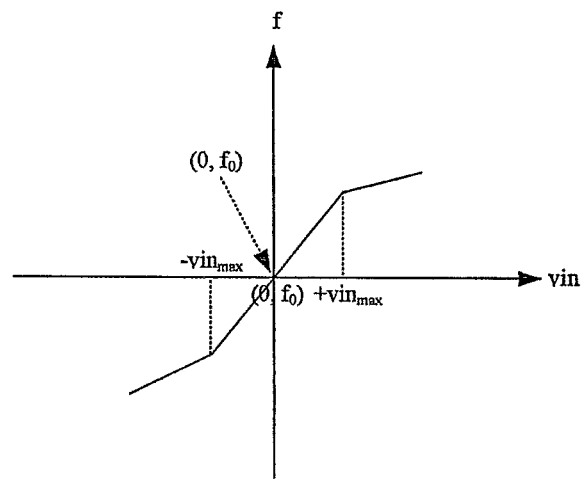
FIG. 2 illustrates an ideal curve showing an input voltage vs. an oscillation frequency of the conventional VCO as shown in FIG. 1.
Figure 3:
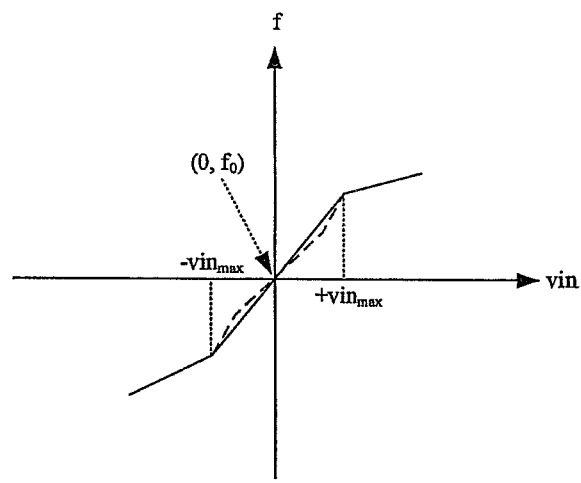
FIG. 3 illustrates an actual curve showing an input voltage vs. an oscillation frequency of the conventional VCO as shown in FIG. 1.
Figure 6:
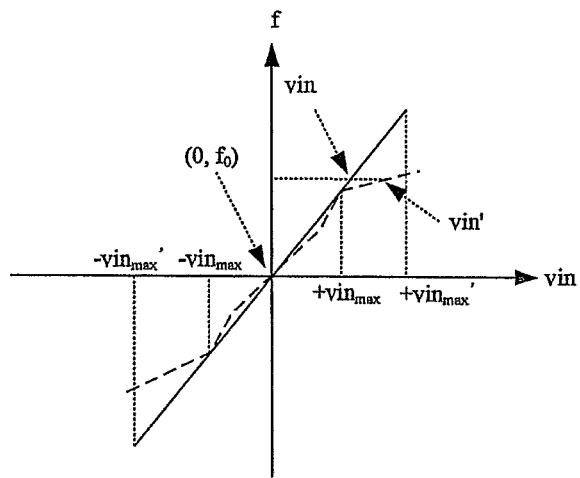
FIG. 6 illustrates an actual curve showing an input voltage vs. an oscillation frequency of the VCO device as shown in FIG. 5.

FIG. 6 illustrates an actual curve (in a solid line) showing the input voltage vin (i. e. the input voltage) vs. the oscillation frequency f of the VCO device 20 as shown in FIG. 5. Also, FIG. 6 illustrates an actual curve (in a dashed line) showing the actual input voltage vin' (i. e. the predistorted voltage) vs. the oscillation frequency f of the VCO 11.

As shown by the dashed line in FIG. 6, if the actual input voltage of the VCO 11 is out of the linear range of the VCO 11, k is not a constant. The linear range of the conventional VCO 11 is only within $-vin'_{max} \leq vin \leq +vin'_{max}$. Moreover, this linear range is still affected by the high order effect of the VCO 11. Thus, an ideal linear characteristic cannot be achieved.

However, as indicated by a horizontal dot line in FIG. 6, the predistortion module 14 generates the predistorted voltage vin' at the input voltage vin, according to the predistortion function. Since the actual input voltage of the VCO 11 is the predistorted voltage vin', the oscillation frequency f of the output signal from the VCO 11 may be f=f0+k0*vin. That is, there is still a linear relationship between the input voltage vin and the oscillation frequency f of the output signal.

Since the predistortion module 14 compensates the non-linear characteristic of the VCO 11, there is a linear relationship between the input voltage vin and the oscillation frequency f of the output signal of the VCO device 20 within the range of $-vin'_{max} \leq vin \leq +vin'_{max}$. The linear range of the VCO device 20 is larger than that of the VCO 11, and also the linearity of the VCO device 20 is higher than that of the VCO 11.

In the VCO device 20 according to the present disclosure, the predistortion module 14 may be established according to the vin-vin' mapping relationship.

Figure 7:
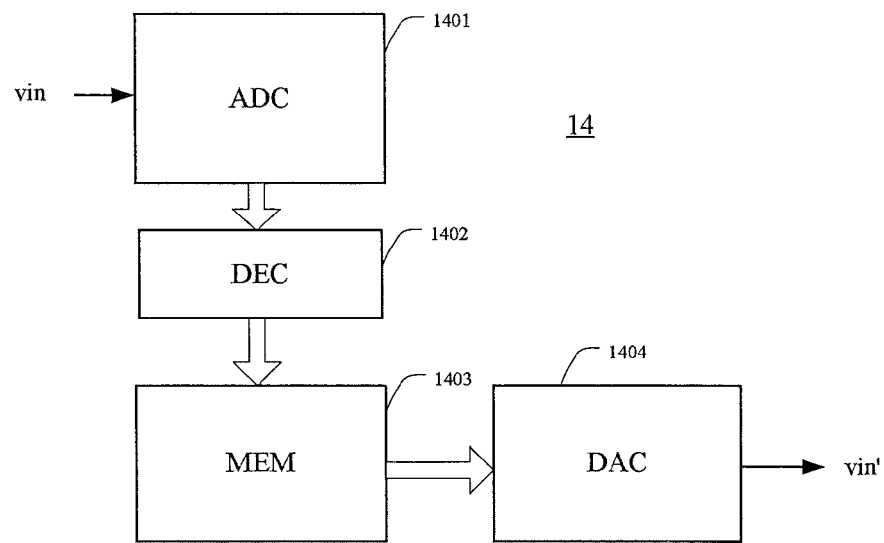
FIG. 7 schematically illustrates a block diagram of a first embodiment of a predistortion module used in the VCO device as shown in FIG. 5.

FIG. 7 schematically illustrates a block diagram of a first embodiment of the predistortion module 14 used in the VCO device 20 as shown in FIG. 5. Although the input voltage vin of the predistortion module 14 and the predistorted voltage vin' (an output voltage) of the predistortion module 14 will be described below, it should be understood that the predistorted voltage vin' is the actual input voltage of the VCO 11 in the VCO device 20.

As shown in FIG. 7, the predistortion module 14 may include an analog-to-digital convertor (ADC) 1401, an address decoding circuit (DEC) 1402, a memory (MEM) 1403 and a digital-to-analog convertor (DAC) 1404, which are connected in series. An input voltage vin is applied to an input port of the ADC 1401. The ADC 1401 may convert the input voltage vin into a digital signal, and transmit it to the DEC 1402. The DEC 1402 may generate an address of the MEM 1403 for read operation from the digitalized input voltage vin, perform read operation on the MEM 1403, and obtains a digital value of a predistorted voltage vin' corresponding to the input voltage The DAC 1404 may convert the digital value of the predistorted voltage vin' into an analog value, and provide it to the VCO 11 as the predistorted voltage vin'.

In the predistortion module 14, the predistortion function may be stored in the MEM 1403, wherein the input voltage vin is the address of the MEM 1403 for read operation, the predistorted voltage vin' is stored content in the MEM 1403.

Figure 8:
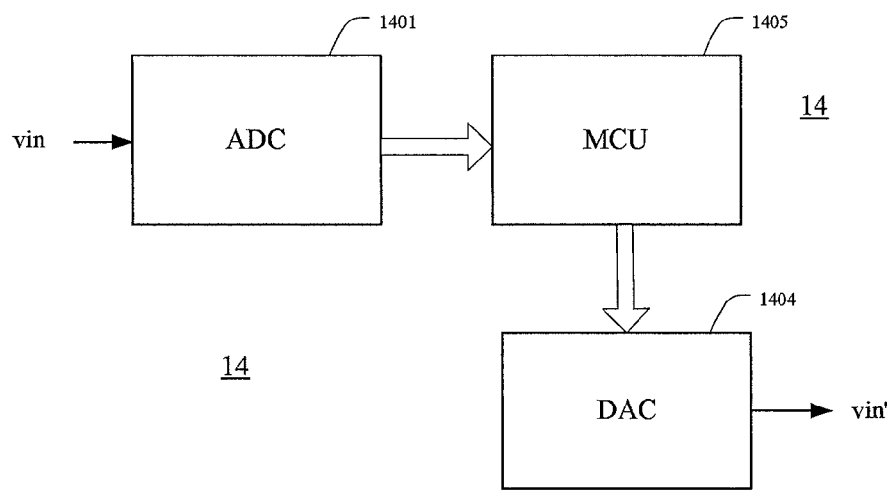
FIG. 8 schematically illustrates a block diagram of a second embodiment of a predistortion module used in the VCO device as shown in FIG. 5.

FIG. 8 schematically illustrates a block diagram of a second embodiment of the predistortion module 14 used in the VCO device as shown in FIG. 5. The predistortion module 14 may include an ADC 1401, a microcontroller unit (MCU) 1405, and a DAC 1404, which are connected in series. An input voltage vin is applied to an input port of the ADC 1401. The ADC 1401 may convert the input voltage vin into a digital signal, and send it to the MCU 1405. The MCU 1405 may search a look-up table in the cache for the digitalized input voltage vin, and obtains the digital value of the predistorted voltage vin' corresponding to the input voltage vin. The DAC 1404 may convert the digital value of the predistorted voltage vin' into an analog value, and provide it to the VCO 11 as the predistorted voltage vin'.

In the predistortion module 14, the predistortion function may be the look-up table in the cache of the MCU 1405, wherein the input voltage vin and the predistorted voltage vin' are two columns of the look-up table.

In a preferred embodiment, if the stored content of the predistortion function does not include the input voltage vin, the predistortion module 14 may search the stored content of the predistortion function for a closest input voltage to obtain an output voltage as the predistorted voltage vin' corresponding to this input voltage vin.

In a preferred embodiment, the predistortion module 14 may also include an interpolation circuit. If the stored content of the predistortion function does not include the input voltage vin, and the input voltage vin satisfies $-vin'_{max} \leq vin \leq +vin'_{max}$, the predistortion module 14 may search the stored content of the predistortion function for lower and higher adjacent input voltages $vin_L$ and $vin_H$ to obtain the corresponding predistorted voltages $vin_L'$ and $vin_H'$, and calculate the predistorted voltage vin' corresponding to the input voltage vin by interpolation in the interpolation circuit according to the following equation:

$$vin' = vin'_L + (vin'_H - vin'_L)/(vin_H - vin_L) * (vin - vin_L)$$

The present disclosure has been described above with reference to the preferred embodiments thereof. It should be understood that various modifications, alternations and additions can be made by those skilled in the art without departing from the spirits and scope of the present disclosure. Therefore, the scope of the present disclosure is not limited to the above particular embodiments but only defined by the claims as attached.

We claim:

1. A voltage-controlled oscillator device, comprising:
    a predistortion module, configured to predistort an input voltage to obtain a predistorted voltage; and
    a voltage-controlled oscillator, configured to generate an output signal with a corresponding oscillation frequency according to the predistorted voltage as an only input to the voltage-controlled oscillator,
    wherein the predistortion module is configured to predistort the input voltage based on only a predistortion function, without depending on a feedback of an output from the voltage-controlled oscillator, to correct a non-linear characteristic of the voltage-controlled oscillator, so that there is a linear relationship between the input voltage and the oscillation frequency of the output signal, and
    wherein the predistortion module is configured to store the predistortion function as a look-up table in a cache or a memory.

2. The voltage-controlled oscillator device according to claim 1, wherein the non-linear characteristic of the voltage-controlled oscillator comprises a non-linear characteristic out of a linear range and a high order effect within the linear range.

3. The voltage-controlled oscillator device according to claim 1, wherein the voltage-controlled oscillator is one selected from a group consisting of an RC voltage-controlled oscillator, an LC voltage-controlled oscillator, a crystal voltage-controlled oscillator, and an active voltage-controlled oscillator.

4. The voltage-controlled oscillator device according to claim 1, wherein the predistortion function represents a relationship between the input voltage and the predistorted voltage.

5. The voltage-controlled oscillator device according to claim 4, wherein the predistortion module comprises an analog-to-digital convertor, a microcontroller unit and a digital-to-analog convertor, which are connected in series, wherein the analog-to-digital convertor converts the input voltage into a digital value; the microcontroller unit searches the look-up table stored in the cache or the memory from the digitalized input voltage, and obtains the digital value of the predistorted voltage; and the digital-to-analog convertor converts the digital value of the predistorted voltage into an analog value, wherein the predistortion function are two columns of the look-up table.

6. The voltage-controlled oscillator device according to claim 5, wherein the predistortion module searches for a closest input voltage and uses the search result as the predistorted voltage, when the look-up table does not include the input voltage.

7. The voltage-controlled oscillator device according to claim 5, wherein the predistortion module further comprises an interpolation circuit, wherein the predistortion module searches the look-up table for lower and higher adjacent input voltages, and takes a result by interpolating the search results as the predistorted voltage, when the look-up table does not include the input voltage.

8. The voltage-controlled oscillator device according to claim 1, wherein a linear range of the voltage-controlled oscillator device is larger than that of the voltage-controlled oscillator.

9. The voltage-controlled oscillator device according to claim 1, wherein a linearity of the voltage-controlled oscillator device is higher than that of the voltage-controlled oscillator.

10. A method of correcting a voltage-controlled oscillator, comprising:
    measuring a predistortion function of the voltage-controlled oscillator;
    storing the predistortion function in a cache or a memory of a predistortion module as a look-up table;
    performing predistortion processing on an input voltage by the predistortion module based on only the predistortion function, without depending on a feedback of an output from the voltage-controlled oscillator, to obtain a predistorted voltage;
    providing the predistorted voltage as an only input to the voltage-controlled oscillator; and generating an output signal with a corresponding oscillation frequency by the voltage-controlled oscillator according to the predistorted voltage,
wherein the predistortion module corrects a non-linear characteristic of the voltage-controlled oscillator, so that there is a linear relationship between the input voltage and the oscillation frequency of the output signal.

11. The method according to claim 10, wherein the predistortion function represents a relationship between the input voltage and the predistorted voltage.

12. The method according to claim 10, wherein measuring the predistortion function of the voltage-controlled oscillator comprises:
calculating, for a set value of the input voltage, a calculated value of the oscillation frequency of the output signal when a linear relationship is satisfied, wherein the set value of the input voltage is used as the input voltage;
applying the input voltage to the voltage-controlled oscillator;
adjusting the input voltage, while measuring an actual oscillation frequency of the output signal of the voltage-controlled oscillator; and
taking an actual value of the input voltage as the predistorted voltage, when the actual oscillation frequency of the output signal of the voltage-controlled oscillator is equal to the calculated value of the oscillation frequency of the output signal.

13. The method according to claim 10, wherein measuring the predistortion function of the voltage-controlled oscillator comprises performing uniform sampling within a designed linear range.

14. The method according to claim 10, wherein measuring the predistortion function of the voltage-controlled oscillator comprises performing non-uniform sampling within a designed linear range, wherein the sampling density at the input voltage approaching a boundary value is higher than that at the input voltage approaching zero.

15. The method according to claim 10, wherein performing the predistortion processing on the input voltage by the predistortion module comprises determining whether the input voltage is out of a designed linear range.

16. The method according to claim 10, wherein performing the predistortion processing on the input voltage by the predistortion module comprises searching for a closest input voltage and using the search result as the predistorted voltage.

17. The method according to claim 10, wherein performing the predistortion processing on the input voltage by the predistortion module comprises searching for a lower and a higher adjacent input voltages, and interpolating the search results as the predistorted voltage.

* * * * *